United States Patent [19]

Denda

[11] Patent Number: 5,217,911
[45] Date of Patent: Jun. 8, 1993

[54] METHOD OF PRODUCING A SEMICONDUCTOR STRUCTURE INCLUDING A SCHOTTKY JUNCTION

[75] Inventor: Masahiko Denda, Itami, Japan

[73] Assignee: Mitsubishi Denki Kabushiki Kaisha, Tokyo, Japan

[21] Appl. No.: 676,115

[22] Filed: Mar. 27, 1991

[30] Foreign Application Priority Data

Jun. 29, 1990 [JP] Japan .................... 2-173182

[51] Int. Cl.$^5$ .................... H01L 21/265; H01L 21/44
[52] U.S. Cl. .................... 437/39; 437/203; 437/228; 156/643
[58] Field of Search .................... 437/39, 911, 68, 203, 437/228; 357/15; 156/643

[56] References Cited

U.S. PATENT DOCUMENTS

| H,40 | 4/1986 | Buchanan et al. | 357/15 |
|---|---|---|---|
| 4,377,031 | 3/1983 | Goto et al. | 357/15 |
| 4,521,795 | 6/1985 | Coe et al. | 357/23.4 |
| 4,764,484 | 8/1988 | Mo | 437/203 |

FOREIGN PATENT DOCUMENTS 63-138768 6/1988 Japan .

OTHER PUBLICATIONS

Totta et al., "Low Barrier Herzht Schottky Barrier Diodes by Metal RF Sputter Deposition Process", IBM Technical Disclosure Bulletin, vol. 20, No. 11B, Apr. 1978, p. 4812.
Wang et al.-"Schottky Barrier Diode with Isotahors Guard Rings", IBM Technical Disclosure Bulletin, vol. 20, No. 8, Jan. 1978, p. 3197.
White et al., "Hybrid Process Oxidation Barrier", IBM Technical Disclosure Bulletin, vol. 22, No. 1, Jun. 1979, p. 126.
Sze "VLSI Technology", McGraw-Hill Book Company, New York, 1988, Second edition, pp. 221-223, pp. 246-249.
Kohn et al., "Charge-Coupled Scanned IR Imaging Sensors", NTIS AD-780 546, Jan. 1974, pp. 22-23.

*Primary Examiner*—Olik Chaudhuri
*Assistant Examiner*—Loc Q. Trinh
*Attorney, Agent, or Firm*—Leydig, Voit & Mayer

[57] ABSTRACT

A method of producing a Schottky junction including a semiconductor substrate and a metal film includes successively producing on a semiconductor substrate a first insulating film, a second insulating film having a different etching speed from that of the first insulating film, and a third insulating film having a different etching speed from that of said second film, exposing a part of the second film by dry etching the third insulating film, etching the second film using the third insulating film as a mask to expose part of the first insulating film, dry etching the first insulating film to expose part of the substrate, and producing a metal film forming a Schottky junction with the substrate on the exposed part of the semiconductor substrate.

3 Claims, 10 Drawing Sheets

METHOD OF PRODUCING A SEMICONDUCTOR STRUCTURE INCLUDING A SCHOTTKY JUNCTION

FIELD OF THE INVENTION

The present invention relates to a production method of a semiconductor device, and more particularly to a Schottky junction comprising a semiconductor substrate and a metal film.

BACKGROUND OF THE INVENTION

Figure 5:
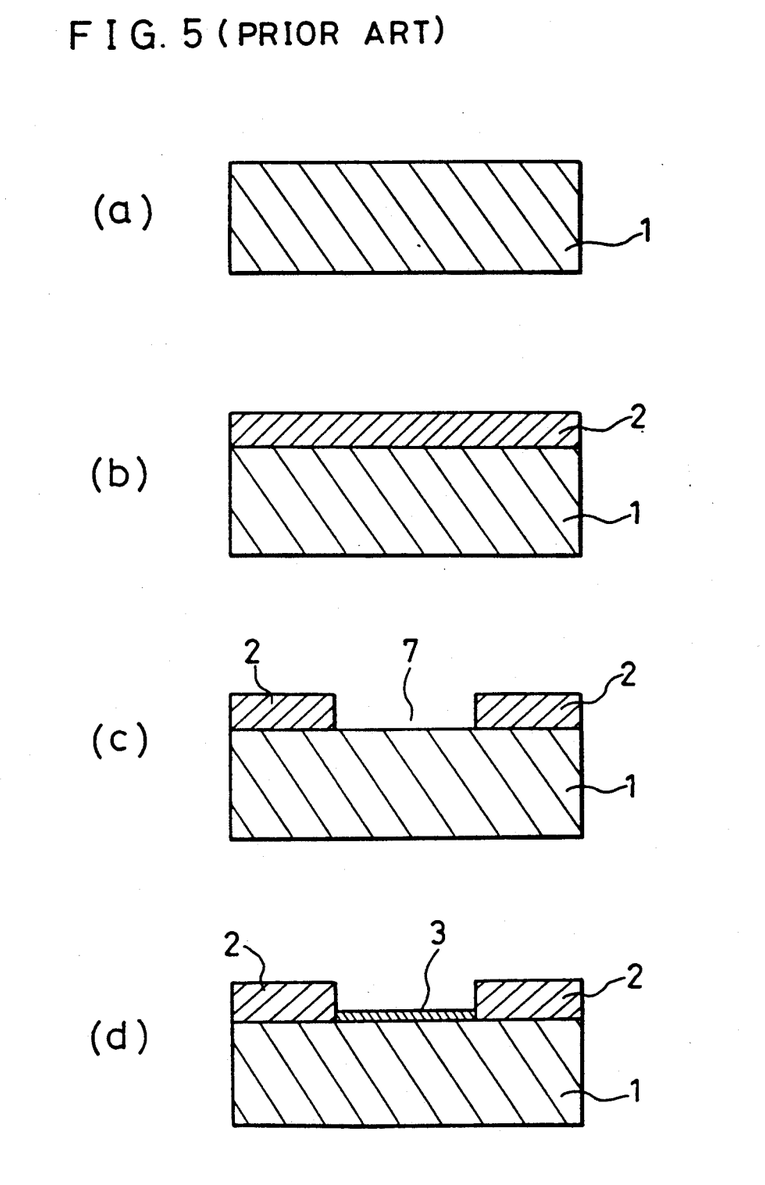

FIGS. 5(a)-5(d) are cross-sectional views showing a prior art production method of a Schottky barrier diode. In FIG. 5(a) reference numeral 1 designates a semiconductor substrate. An insulating film 2 is produced on the semiconductor substrate 1. A metal film 3 is provided on the semiconductor substrate 1 to produce one electrode of the Schottky barrier diode. Reference numeral 7 designates an aperture of the insulating film 2. The other electrode of the Schottky barrier diode is not shown here.

The production method of the Schottky diode is described with reference to FIGS. 5(a) to 5(d).

As shown in FIG. 5(a), a semiconductor substrate 1 is prepared. As this semiconductor substrate 1, for example silicon monocrystal is used.

Next, as shown in FIG. 5(b), an insulating film 2 is produced on the semiconductor substrate 1 by such as thermal oxidation or chemical vapor deposition. As this insulating film 2 silicon dioxide ($SiO_2$) is used.

Next, as shown in FIG. 5(c), an aperture 7 is produced on the insulating film 2 at a portion on the semiconductor substrate 1 corresponding a portion where a Schottky barrier diode is to be produced. The production of this aperture can be easily performed by, for example when the insulating film is silicon dioxide film, producing a pattern of photoresist film on the silicon dioxide film by photolithography and etching the silicon dioxide film with a hydrofluoric acid solution using this photoresist film as a mask. By removing the photoresist film with sulfuric acid or an oxygen plasma after the etching, an aperture 7 is produced at the silicon dioxide film 2.

Then, as shown in FIG. 5(d), a metal thin film 3 is produced on the semiconductor substrate 1 in the aperture of the insulating film 2 and a Schottky barrier diode is thus produced. As a production method of this metal thin film 3, an electron beam deposition or sputtering is employed.

When platinum silicide is used for the metal film 3 and silicon is used for the semiconductor substrate 1, when annealing is performed after the platinum film is produced on the entire surface, the platinum in contact with silicon is silicided to produce platinum silicide, and when it is immersed in aqua regia after the annealing, platinum which is not silicided on the insulating film 2 is dissolved by the aqua regia and a metal side electrode of Schottky junction is selectively produced only at the aperture where the silicon substrate is exposed.

Because the Schottky diode is an element having a junction between the surface of a semiconductor substrate and a metal film in contact therewith, it is strongly influenced by the state of surface of the semiconductor and the crystallinity of semiconductor substrate in the vicinity of the surface. Accordingly, processes producing low contaimination and damage are required to be used for producing the insulating film 2 on the semiconductor substrate 1, for producing an aperture on the insulating film 2, and for producing metal electrode 3 of the Schottky diode.

Wet etching methods which have been utilized conventionally are those for removing material by using chemicals utilizing a chemical reaction at the liquid phase-solid phase interface. Those methods etch selectively between materials, have good processing ability, and do not damage the substrate. However, when this method is employed for producing a pattern, so-called transverse etching in which the etching advances with the solution circulating below the etching mask is likely to arise. Particularly when a photoresist which is inferior in adhesiveness to respective kinds of films constituting a semiconductor device is used, such transverse etching cannot be avoided.

When a Schottky barrier diode of FIG. 5(d) is integrated in integrated circuit, the film thickness of the insulating film 2 has to be approximately 1 micron in thickness in order to reduce the parasitic capacitance. When an aperture is to be produced on such a thick insulating film by utilizing a wet etching, etching in the transverse direction is large and a fine pattern is not obtained.

In recent fabrication process of semiconductor devices dry etching is used especially for monocrystalline silicon, polycrystalline silicon, silicon dioxide films, and aluminum films. Of dry etching processes, those utilizing reactive ion etching are advancingly developed.

These methods permit etching close to the dimension of a mask pattern because an etching reaction arises with reactive ions being accelerated in a direction perpendicular to the substrate surface and the etching amount in the transverse direction is small, so that a wide range of application is possible including to photoresist which has less adhesiveness to respective kinds of films constituting the semiconductor device, and to miniaturization of a pattern. As a result of that, it is possible to use a positive type photoresist and an apparatus of the step and repeat type can be used as an exposure apparatus in the photolithography, thereby enhancing the mask alignment precision where different kinds of films in the semiconductor device are successively processed using photoresist as mask material.

However, in RIE, etching is performed by reactive ions colliding with the film to be etched and damage accompanying the collision of ions and contaminations due to attachment of ions which do not participate in etching occurs.

Schottky barrier diodes are quite weak to the contamination of surfaces and defects in the vicinity of surface because they use a junction at an interface between the surface of semiconductor and the metal in contact therewith. Particularly in a device using a thin film of platinum silicide about 50 angstroms thick as in an infrared detecting element using a Schottky barrier diode of platinum silicide and silicon, the interface between the silicide and silicon is likely to be influenced by the silicon surface and it may become impossible to detect the infrared due to damage in silicon substrate. Thus, in the prior art device it was impossible to employ RIE for aperturing the insulating film 2 which is produced on the substrate 1.

Figure 6:
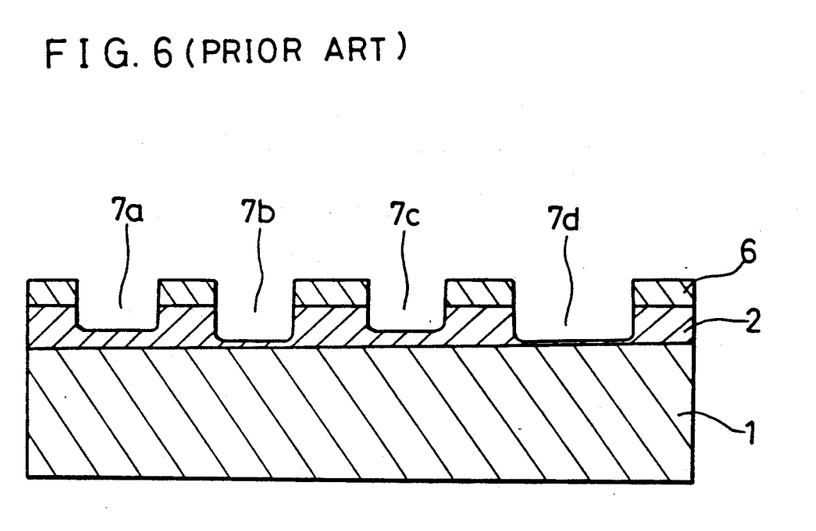
FIG. 6 is a diagram for explaining problems in the prior art.

Further, methods utilizing the above-described wet etching method and RIE in which a hole is dug through the insulating film 2 and thereafter an aperture is provided by wet etching is thought of. However, the etching speed by RIE easily varies dependent on the process conditions such as pressure and is difficult to control. Therefore, it is likely to cause variations in the depth of the apertures 7a to 7d of the insulating film 2 which is produced by RIE as shown in FIG. 6 caused by non-uniformity of etching speed in wafer surface over the entirety of the etched material, non-uniformity of the film thickness, variations in the film thickness of the etched material whereby the wet etching after the RIE cannot be performed uniformly.

As discussed above, in the prior art production process of a semiconductor device, there is a problem in that when a wet etching is used to produce an aperture in an insulating film on a substrate, a fine pattern is not obtained because of etching in the transverse direction and there is also a problem in that the RIE is inappropriate for production of a Schottky barrier diode because it damages the surface of substrate at the interface of Schottky junction and deteriorates the element characteristics. Further, in a method using RIE and wet etching for the production of an aperture of an insulating film, the etching by RIE cannot be performed uniformly in wafer, and the wet etching process thereafter cannot be performed with high controllability.

SUMMARY OF THE INVENTION

The present invention is directed to solving the above described problems and has for its object to provide a production method of a semiconductor device that can produce an aperture with high precision without contaminating and damaging the surface of semiconductor substrate in providing the aperture for producing a metal layer in Schottky contact with the substrate and that further can produce a metal layer having a Schottky junction with the substrate on the substrate with high reproducibility and high precision.

Other objects and advantages of the present invention will become apparent from the detailed description given hereinafter; it should be understood, however, that the detailed description and specific embodiment are given by way of illustration only, since various changes and modifications within the spirit and the scope of the invention will become apparent to those skilled in the art from this detailed description.

In accordance with an aspect of the present invention, a production method of a semiconductor device having a Schottky junction formed by a semiconductor substrate and a metal film includes a process of producing a first thin insulating film on a semiconductor substrate, a process of producing a second film having different etching speed from the first insulating film at least at a portion of the first insulating film, a process of producing a third insulating film having a different etching speed from that of the second film on the second film, a process of producing an aperture at a part of the third insulating film with high controllability and high uniformity by a dry first etching thereby to expose a part of the second film, a process of etching the third insulating film by a dry or wet second etching using the third insulating film as a mask thereby to expose the first insulating film, a process of etching the third insulating film and the first insulating film exposed by the aperture of the second film by a wet etching thereby to expose the surface of the semiconductor substrate without damaging the same, and a process of producing a metal film on the semiconductor substrate where it is exposed by the aperture.

In accordance with the present invention, a second film having a different etching speed from the first insulating film is produced on the first insulating film and a third insulating film having a different etching speed from the second film is produced thereon and these films are successively etched by first to third etchings to provide an aperture for producing a metal film on the substrate. Therefore, the second film functions as a stopper when the third insulating film is etched by the first etching, and selective etching of the third insulating film is possible, resulting in a fine aperture superior in pattern controllability. Furthermore, when the second film is etched by the second etching, the third and the first insulating film function as a mask and a stopper, respectively, and the second film can be etched selectively relative to the third and the first insulating films, whereby an aperture can be produced at the aperture of the third insulating film accurately without damaging the first insulating film. Finally, while etching the first insulating film, the first insulating film is etched by wet etching which has a selectivity for the thin first insulating film relative to the substrate and the etching is performed with high pattern controllability without contamination or damaging the substrate surface, and an aperture having a designed dimension can be obtained on the substrate with high controllability and high reproducibility.

BRIEF DESCRIPTION OF THE DRAWINGS

FIGS. 1(a) to 1(h) are cross-sectional views showing respective main steps of a production process of a Schottky barrier diode in accordance with a first embodiment of the present invention;

FIGS. 2(a) to 2(j) are cross-sectional views showing respective main steps of a production process for integrating a Schottky barrier diode in accordance with a first embodiment of the present invention;

FIGS. 3(a) to 3(i) are cross-sectional views showing respective main steps of a production process of a Schottky barrier diode in accordance with another embodiment of the present invention;

FIGS. 4(a) to 4(j) are cross-sectional views showing respective main steps of a production process for integrating a Schottky barrier diode in accordance with another embodiment of the present invention;

FIGS. 5(a) to 5(d) are cross-sectional views showing respective main steps of a production process of a Schottky barrier diode in accordance with the prior art.

DETAILED DESCRIPTION OF THE PREFERRED EMBODIMENTS

An embodiment of the present invention will be described in detail with reference to the drawings.

Figure 1:
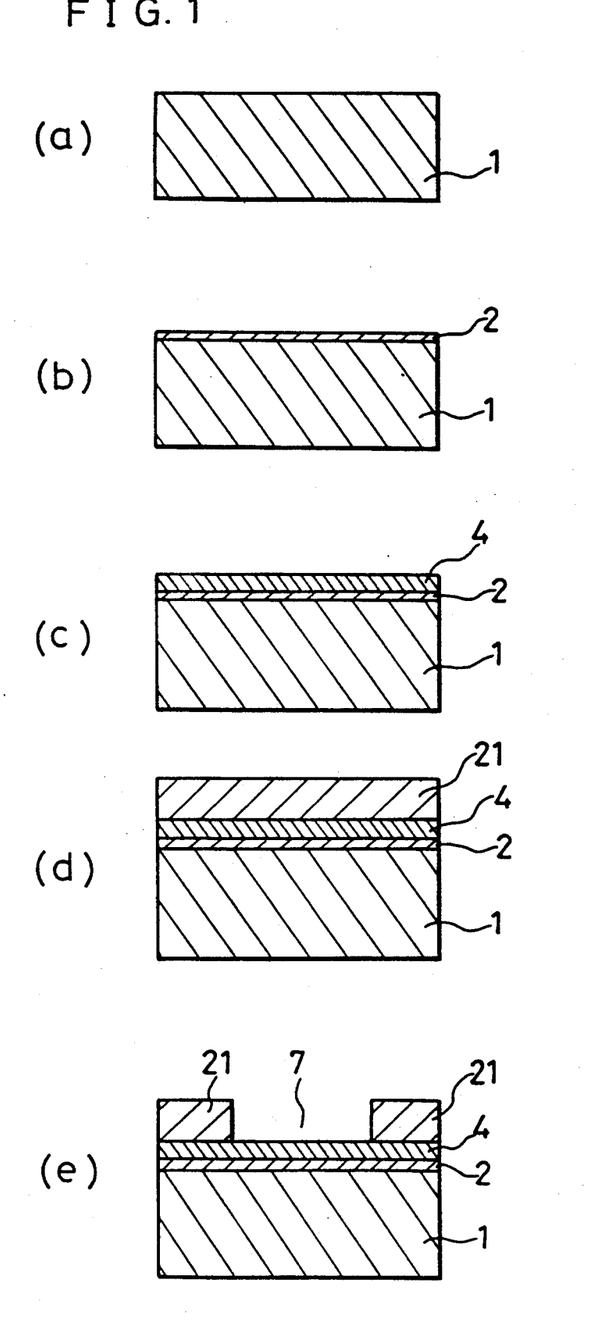

FIGS. 1(a) -1(h) are diagrams showing a production process of a semiconductor device according to a first embodiment of the present invention. In FIG. 1(a), reference numeral 1 designates a silicon substrate. Numerals 2 and 21 designate silicon dioxide films. Numeral 3 designates a platinum silicide as a metal electrode of the Schottky barrier diode. Numeral 4 designates a polycrystalline silicon. Numeral 7 designates an aperture of the silicon dioxide film.

A description is given of the production process of this embodiment with reference to FIG. 1(a) to 1(h).

First of all, a silicon dioxide film 2 is produced on the silicon substrate 1. This silicon dioxide film 2 can be produced by thermal oxidation or chemical vapor deposition and the film thickness is about 500 to 1000 angstroms (FIGS. 1(a) to 1(b)).

Next, a polycrystalline silicon film 4 is produced on the silicon dioxide film 2. A CVD method is used therefor and the film thickness is about 0.5 micro (FIG. 1(c)).

A silicon dioxide film 21 is again produced on the polycrystalline silicon film 4 by such as CVD. This silicon dioxide film 21 may be a phosphor-silicate-glass film (hereafter referred to as PSG) or boron phosphor-silicate-glass film (hereinafter referred to as BPSG) depending on the purpose for use. As the film thickness, at least 1 micron is required (FIG. 1(d)).

A photoresist film (not shown) is produced on the silicon dioxide film 21 and the silicon dioxide film 21 is etched by RIE using the photoresist film as a mask. As conditions for this RIE, a freon series gas such as $CHF_3$, $CCl_2F_2$, $CBrF_3$, or $C_2F_4$ is used, pressure is held at $10^{-2}$ Torr, power is 400 to 500 W, and the plasma frequency is 13.56 MHz. Under such conditions, selectivity can be provided between the polycrystalline silicon 4 and silicon dioxide 21. When $CHF_3$ gas is used, the etching speed of the polycrystalline silicon 4 is about one tenth against the silicon dioxide film 21. By selective etching, the polycrystalline silicon 4 becomes a stopper in the RIE process, and the etching is stopped at this layer. Further, since a dry process is used for etching, even when the adhesiveness between the silicon dioxide film 21 and the photoresist is not strong, etching in the transverse direction does not arise and an aperture 7 close to the photoresist pattern is obtained. Furthermore, since the adhesion of the photoresist is not required to be strong, it is possible to use a positive type photoresist with a high resolution and an exposure apparatus of the step and repeat system, and the fine patterning and high precision mask alignment are possible (FIG. 1(e)).

Next, a part of the polycrystalline silicon film 4 which is exposed to the aperture 7 of the silicon dioxide film is etched by the usual plasma etching method. Since the plasma etching using a gas such as $CF_4$ has a high selectivity relative to the silicon dioxide film, the upper silicon dioxide film 21 functions as a mask against the etching of the polycrystalline silicon and the lower silicon dioxide film 2 functions as stopper for etching. The conditions for the plasma etching method are, when $CF_4$ gas is used, pressure of $10^{-2}$ Torr, power of 200 W, and plasma frequency of 13.56 MHz. Such usual plasma etching advances as a reaction of a wet gas as compared with the above-described RIE and gives no damage to the surface of the silicon dioxide film 2 which functions as a stopper. Furthermore, it is a dry process similarly as RIE and the etching can be performed close to the size of the aperture 7 (FIG. 1(f)).

Thereafter, a part of the silicon dioxide film 2 exposed by the aperture is removed by wet etching and the surface of the substrate 1 is exposed. As an etching solution for this wet etching, hydrofluoric acid aqueous solution or a mixed aqueous solution of hydrofluoric acid and ammonium fluoride is effectively used it is possible to etch only the silicon dioxide film with a large selectivity relative to the monocrystalline silicon substrate 1. Then, the polycrystalline silicon 4 functions as a mask material. Furthermore, since the silicon dioxide film 2 is quite thin, e.g., 500 to 1000 angstroms, there is almost no etching in the transverse direction in such a thin film, which has been a problem in the conventional wet etching process and there is no problem in practical use. Therefore, no contamination or damage has occurred to the surface of substrate by the wet etching and the dimension of the aperture can be realized accurately (FIG. 1(g)).

Thereafter, as shown in FIG. 1(h), a metal thin film layer 3 is produced on the semiconductor substrate 1 exposed by the aperture 7 of the insulating film 2 to produce a Schottky junction. As a production method for this metal thin film 3, an electron beam deposition method, sputtering or the like are employed.

Furthermore, when platinum silicide 3 is used for the metal film, by annealing after producing a platinum film on the entire surface of substrate, the platinum in contact with silicon is silicided to produce a platinum silicide 3 and thereafter it is immersed in aqua regia. Then, platinum which is not silicided on the insulating film 2 is dissolved by aqua regia and a metal electrode of a Schottky junction is selectively produced on the aperture where the silicon substrate was exposed.

In this embodiment of the invention, the insulating film is made of a three-layer structure, and first of all, a silicon dioxide film 2 is provided as a first layer, a polycrystalline silicon film 4 having an etching selectivity relative to the first layer is provided as a second layer, and a thick silicon dioxide film 21 having an etching selectivity relative to the second layer film is produced as a third layer, an aperture 7 is produced on the third layer silicon dioxide film 21 by such as RIE having good pattern reproducibility. Using the polycrystalline silicon film 4 as a stopper layer, the polycrystalline silicon film 4 exposed at the aperture is etched by plasma etching and a reactive ion beam etching using electron cyclotron resonance which gives no damage to the silicon dioxide film and further the thin first layer silicon dioxide film 2 is etched by wet etching giving no damages to the surface of substrate and a metal thin film producing a Schottky junction is produced at the aperture. Thereby, there arises no contamination or damage of the surface of semiconductor substrate and a high precision Schottky junction is produced.

While in the above-described embodiment RIE is used for the etching of the third layer silicon dioxide film 21, another dry etching method which can perform etching prudently to the configuration of aperture of photoresist and can perform fine patterning can be used.

While in the above-described embodiment plasma etching is used for the etching of the second layer polycrystalline silicon film 4, other etching methods in which etching advances in accordance with the pattern dimension without damaging to the surface of the first layer silicon dioxide film 2 as a stopper layer, for example, reactive ion beam etching of the electron cyclotron resonance type can be used. In this method, in particular, the etching can be performed with low damage and low contamination.

In the above-described embodiment wet etching is used for etching the first layer silicon dioxide film 2. As for this etching, it is required that contaminations and damages given to the surface of substrate are less. Furthermore, an etching of less variation in the pattern dimension is preferred and other etching methods which can realize such etching can be employed.

In the production method of a Schottky diode of the above-described embodiment a process of producing the polycrystalline silicon film 4 is added. However, in a case where a Schottky barrier diode is incorporated in an integrated circuit, polycrystalline silicon film which becomes a gate electrode on a silicon dioxide film is produced in the production process of a MOS type transistor and the silicon dioxide film and the polycrystalline silicon film can be used as 2 and 4 in FIG. 1 and therefore, the production process is not complicated.

Figure 2:
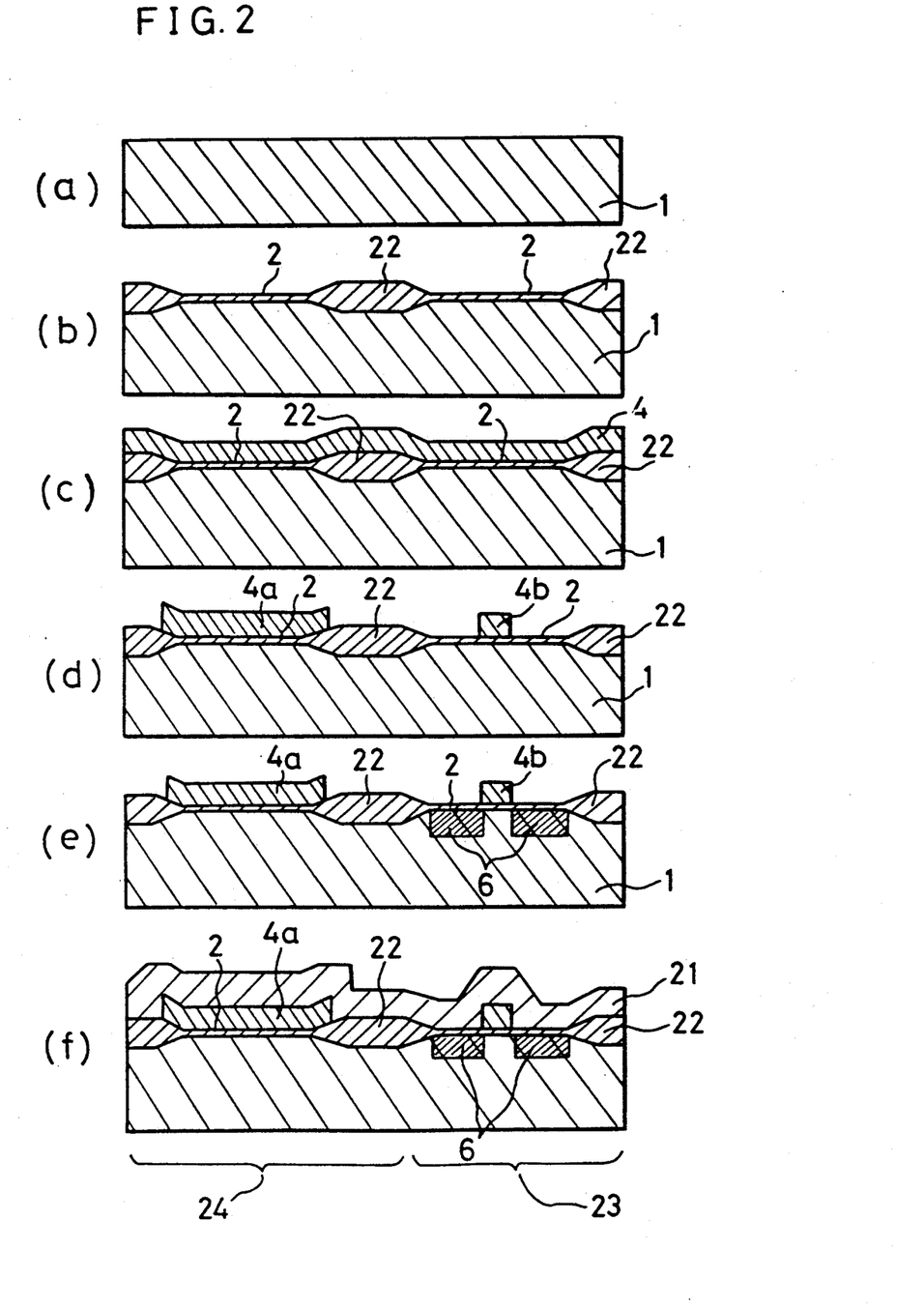

An example in which a MOS type transistor and a Schottky barrier diode are produced on a substrate at the same time will be described with reference to FIGS. 2(a) to 2(j). In FIG. 2(j), the same reference numerals designate the same elements as those shown in FIG. 1(h). Reference numeral 22 designates an element separating insulating film 2 into two parts. Reference numeral 4b designates a polycrystalline silicon film. Numeral 4b designates a polycrystalline silicon gate electrode. Numeral 6 designates an n type region. Numeral 23 designates a MOS type transistor region. Numeral 24 designates a Schottky barrier diode region.

First of all, as shown in FIG. 2(a), a p type silicon substrate is prepared and a thin silicon dioxide film 2 of about 500 to 1000 angstroms thickness is produced on the MOS transistor region 23 and the Schottky barrier diode region 24 and at the same time a thick element separating silicon dioxide film 22 is selectively produced on the other region (FIG. 2(b)).

Next, a polycrystalline silicon film 4 of about 0.5 micron thickness is produced on the entire surface of substrate (FIG. 2(c)), and by etching using photoresist (not shown) as a mask, a polycrystalline silicon film pattern 4a is produced on the Schottky barrier diode region 24 and a gate electrode pattern 4b is produced on the MOS transistor region 23 (FIG. 2(d)).

Then, n type regions becoming source and drain regions are produced self-alignedly by ion implantation using the gate electrode 4b as a mask (FIG. 2(e)).

Thereafter, a silicon dioxide film 21 is deposited on the entire surface by CVD method (FIG. 2(f)), and the silicon dioxide film at the Schottky barrier diode region 24 is selectively etched by RIE using the photoresist as a mask, thereby exposing the polycrystalline silicon film 4a at the aperture. This etching is performed by the similar method similar to the process of FIG. 1(e) (FIG. 2(g)).

Subsequently, by the similar method as the process of FIG. 1(f), the polycrystalline silicon film 4a exposed by the aperture of the silicon dioxide film 21 is etched using the silicon dioxide film 2 as a stopper by the method such as plasma etching (FIG. 2(h)).

Thereafter, by a method similar to the process of FIG. 1(g), the silicon dioxide film 2 exposed to the aperture is removed by the wet etching, the substrate surface is exposed (FIG. 2(i)), and a platinum silicide film 3 is produced on the exposed silicon substrate 1 (FIG. 2(j)).

In this way, in the method of incorporating a Schottky barrier diode in an integrated circuit, the process of producing the silicon dioxide film 2 and the process of producing the polycrystalline silicon film 4a on the silicon dioxide film 2 can be performed by the same process as that of the process of producing the element separating insulating film 21 and the process of producing the gate electrode 4b, respectively. Therefore, there is no necessity of adding an extra production process for producing a Schottky barrier diode and the process is simplified.

Furthermore, since RIE, which has less etching in the transverse direction, is used for producing an aperture at the silicon dioxide film 21, a thick silicon dioxide film 21 can be produced and the insulating film for separating the FET from the adjacent MOS transistors can be also produced thick. Therefore, it is possible to prevent a channel region being produced at a field region and further it is possible to prevent generation of parasitic MOS transistors.

Furthermore, in a production method of an actually used Shottky diode, a second conductivity type region called a guard ring can be provided to avoid leakage at the periphery of the Schottky junction or a second conductivity type region for giving a voltage to the metal electrode of the Schottky diode can be provided.

(FIGS. 3(a)-3(i) show a second embodiment of the present invention which is provided with a second conductivity type region. In those figures, the same reference numerals designate the same or corresponding portions and the conductivity type of semiconductor substrate is made p type. Reference numeral 5 designates a photoresist and reference numeral 11 designates an n type region.

Figure 3:
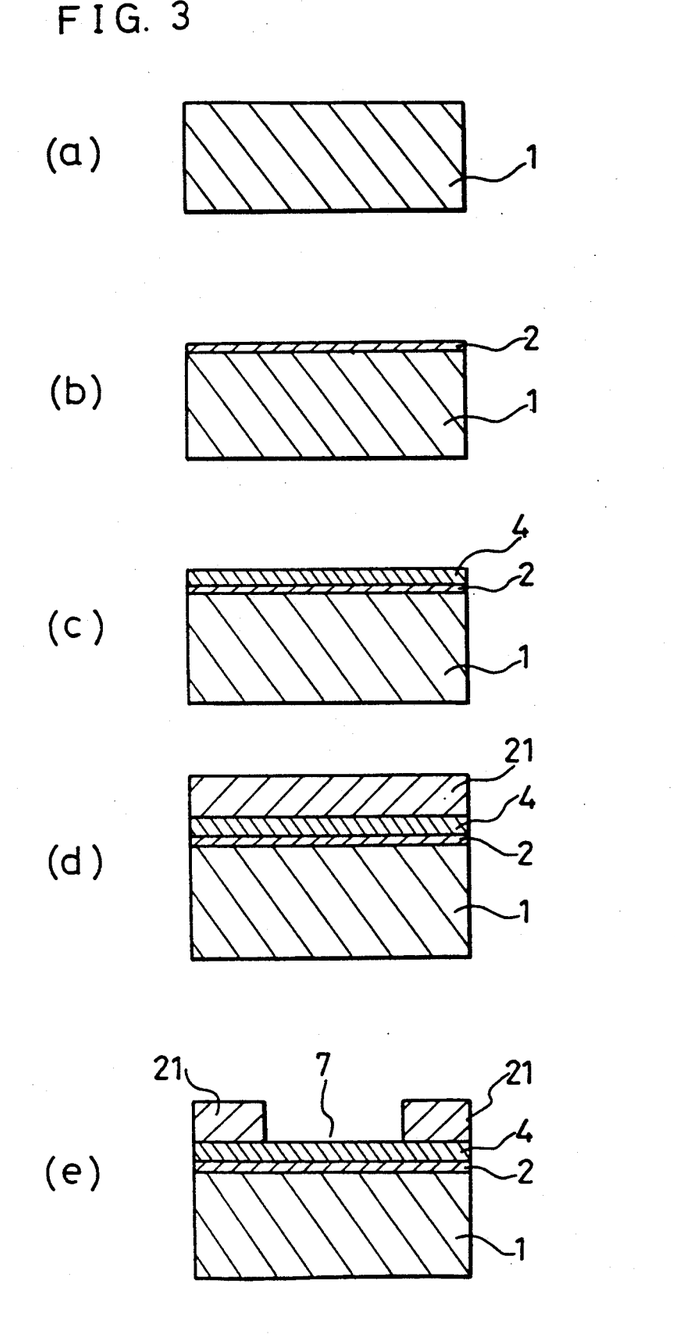

In the embodiment shown in FIG. 3(f), the processes up until an aperture is provided at the polycrystalline silicon 4 are the same as those of FIG. 1(a) to 1(f).

After the process of FIG. 3(f), a part of the aperture is coated with photoresist 5 and n type impurities are introduced by ion implantation or thermal diffusion and n type regions 11 are produced (FIG. 3(g)).

Thereafter, the photoresist 5 is removed and similarly as in the case of FIG. 1(g), the silicon dioxide film 2 exposed to the aperture 7 is removed by the wet etching. As an etching solution for the wet etching, hydrofluoric acid solution is used and only the silicon dioxide film is etched selectively relative to the monocrystalline silicon substrate 1. Furthermore, since the silicon dioxide film 2 has a small thickness, i.e., 500 to 1000 angstroms, etching which can realize the dimension of the aperture accurately is possible without contaminating and damaging the surface of substrate (FIG. 3(h)).

Thereafter, as shown in FIG. 3(i), a metal thin film 3 is produced on the semiconductor substrate 1 exposed by the aperture 7 of the insulating film 2 and a Schottky junction is produced. As a method of producing this metal thin film 3, electron beam deposition or sputtering are employed.

The n type region 11 is produced at the periphery of the Schottky diode and functions as a guard ring.

The production method where a Schottky barrier diode having a second conductivity type region (n type region) and MOS transistor are produced on the same substrate are shown in FIGS. 4(a) to 4(j). In those figures reference numeral 61 designates an n type region called a guard ring.

Figure 4:
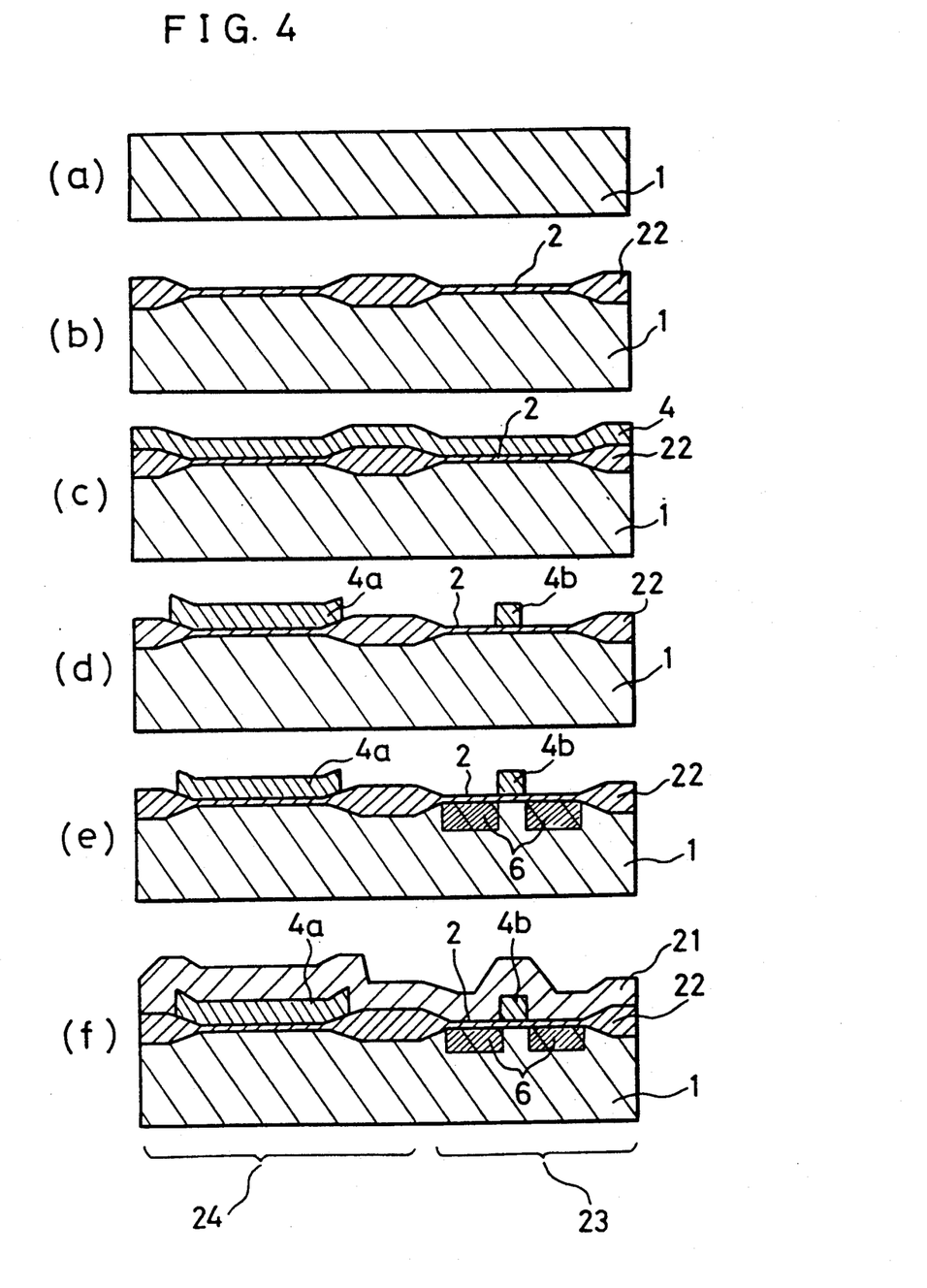

The production method of FIGS. 4(a) to 4(g) are the same as those of FIGS. 2(a) to 2(g) and the processes after FIG. 4(n) are the same as those of FIGS. 3(g) to 3(i) with respect to the portion of Schottky barrier diode.

While in the above-illustrated embodiments an ion implantation is performed using the photoresist 5 as a mask after an aperture is provided at the polycrystalline silicon 4, thereby to produce n type regions 11 and 61, respecively, when they are integrated on an integrated circuit, n type region impurities can be implanted using the photoresist as a mask after the process of FIG. 3(c) (FIG. 4(d)). Furthermore, after the process of FIG. 3(c) (FIG. 4(d)), a part of the polycrystalline silicon or that part together with a part of the silicon dioxide film can be removed and thereafter ion implantation can be performed to produce an n type region.

As described above, according to the present invention, a film having a different RIE etching speed relative to the insulating film is produced on the first layer insulating film as a stopper layer and the second insulating film is produced thereon, and the upper layer insulating film is etched by RIE and the intermediate layer is etched selectively relative to the first layer insulating film and subsequently the first insulating film is etched by wet etching to produce an aperture thereby to produce a Schottky junction. A Schottky junction having quite a high precision can be produced as designed without contamination and damage at the surface of semiconductor substrate. Furthermore, the Schottky barrier diode can be integrated in an integrated circuit by the same processes as the production processes of MOS transistors and the production is simplified without increasing the production process number.

As is evident from the foregoing description, according to the present invention, a film having a different etching speed from the insulating film is produced between insulating films on a substrate. Therefore, the wet etching and the dry etching can be separately used in producing an aperture at the insulating film and a Schottky junction having a high precision and having no contamination and damage to the semiconductor substrate can be easily produced with high controllability and high reproducibility.

What is claimed is:

1. A method of producing a Schottky junction including a semiconductor substrate and a metal film comprising the steps of:

depositing a first silicon dioxide film on a silicon substrate;

depositing a polycrystalline silicon film having a different etching speed from that of said first silicon dioxide film on at least a part of said first silicon dioxide film;

depositing a second silicon dioxide film having a different etching speed from that of said polycrystalline silicon film on said polycrystalline silicon film;

opening an aperture in part of said second silicon dioxide film to expose part of said polycrystalline silicon film by reactive ion etching using a freon gas;

reactive ion etching said polycrystalline silicon film at the aperture using said second silicon dioxide film as a mask to expose part of said first silicon dioxide film;

wet etching said first silicon dioxide film with hydrofluoric acid using said polycrystalline silicon film and said second silicon dioxide film as a mask to expose part of said silicon substrate; and depositing a metal film producing a Schottky junction with said silicon substrate on the exposed part of said silicon substrate.

2. A method of producing a Schottky junction as defined in claim 1 including reactive ion etching said polycrystalline silicon film using one of plasma etching and electron cyclotron resonance ion etching.

3. A method of producing a Schottky junction as defined in claim 2 including etching said second silicon dioxide film with $CHF_3$ gas, etching said polycrystalline silicon film in a plasma of $CH_4$ gas, and etching said first silicon dioxide film with an aqueous HF solution.

* * * * *